US007710098B2

(12) United States Patent
Garner et al.

(10) Patent No.: US 7,710,098 B2
(45) Date of Patent: May 4, 2010

(54) POWER SUPPLY DRIVER CIRCUIT

(75) Inventors: David Michael Garner, London (GB);
Niek van der Duijn Schouten,
Cambridge (GB)

(73) Assignee: Cambridge Semiconductor Limited,
Cambridge (GB)

(*) Notice: Subject to any disclaimer, the term of this patent is extended or adjusted under 35 U.S.C. 154(b) by 678 days.

(21) Appl. No.: 11/639,820

(22) Filed: Dec. 15, 2006

(65) Prior Publication Data
US 2007/0182386 A1 Aug. 9, 2007

Related U.S. Application Data

(60) Provisional application No. 60/756,537, filed on Jan. 5, 2006.

(30) Foreign Application Priority Data
Dec. 16, 2005 (GB) ................................ 0525619.3

(51) Int. Cl.
*H02M 3/125* (2006.01)
(52) U.S. Cl. .......................... 323/351; 363/98; 315/291
(58) Field of Classification Search ................ 315/291, 315/224, 225, 209 R, 307, DIG. 7; 363/97, 363/98, 17, 56; 323/351, 282, 283, 284; 327/112, 333
See application file for complete search history.

(56) References Cited
U.S. PATENT DOCUMENTS

| 4,109,194 | A | 8/1978 | Miller |
| 4,356,542 | A | 10/1982 | Bruckner et al. |
| 4,994,955 | A | 2/1991 | Schoofs et al. |
| 5,068,571 | A | 11/1991 | Schoofs |
| 5,274,274 | A | 12/1993 | Leman et al. |
| 5,479,090 | A | 12/1995 | Schultz |

(Continued)

FOREIGN PATENT DOCUMENTS

DE    195 15 210 A1    10/1996

(Continued)

OTHER PUBLICATIONS

Matsuo, H., et al., "Novel digital controller for the PWM and/or PFM controlled switching DC-DC converters," Telecommunications Energy Conference, 1998, Intelec. 20$^{th}$ Int'l, San Francisco, CA, pp. 225-230.

*Primary Examiner*—Douglas W Owens
*Assistant Examiner*—Ephrem Alemu
(74) *Attorney, Agent, or Firm*—Knobbe, Martens, Olson & Bear LLP

(57) ABSTRACT

A high-side driver circuit for a switching power supply, configured to translate a low-side switching control signal referenced to a first ground rail to a high-side switching control signal referenced to a second, high-side ground rail for driving a switching control connection of a power switching device, the high-side driver circuit including first and second inputs to receive first and second low-side switching control signals; a differential amplifier having a differential pair of inputs coupled to said first and second inputs and having an output, the differential amplifier having a ground connection for connection to said high-side ground rail and a power connection to receive a power supply from a second voltage supply; and an output coupled to said differential amplifier output to provide the high-side switching control signal.

36 Claims, 3 Drawing Sheets

U.S. PATENT DOCUMENTS

| | | |
|---|---|---|
| 5,568,044 A | 10/1996 | Bittner |
| 5,631,494 A | 5/1997 | Sakurai et al. |
| 5,631,550 A | 5/1997 | Castro et al. |
| 5,656,968 A | 8/1997 | Sander et al. |
| 5,737,169 A | 4/1998 | Sellers |
| 5,757,625 A | 5/1998 | Schoofs |
| 5,892,672 A | 4/1999 | Preller |
| 5,936,852 A | 8/1999 | Weinmeier et al. |
| 6,005,377 A | 12/1999 | Chen et al. |
| 6,037,720 A * | 3/2000 | Wong et al. .................. 315/291 |
| 6,137,696 A | 10/2000 | Hall et al. |
| 6,275,018 B1 | 8/2001 | Telefus et al. |
| 6,304,473 B1 | 10/2001 | Telefus et al. |
| RE37,609 E | 3/2002 | Bittner |
| 6,362,679 B2 * | 3/2002 | Wile ........................... 327/382 |
| 6,396,718 B1 | 5/2002 | Ng et al. |
| 6,703,684 B2 | 3/2004 | Udrea et al. |
| 6,781,422 B1 | 8/2004 | Yang |
| 6,781,423 B1 | 8/2004 | Knoedgen |
| 6,897,492 B2 | 5/2005 | Ochi |
| 2002/0057080 A1 | 5/2002 | Telefus et al. |
| 2002/0097008 A1 | 7/2002 | Krummel |
| 2004/0037094 A1 | 2/2004 | Muegge et al. |
| 2004/0174722 A1 | 9/2004 | Kunii |
| 2004/0227539 A1 | 11/2004 | Thiery |
| 2005/0052249 A1 | 3/2005 | Gan et al. |
| 2005/0270008 A1 | 12/2005 | Kuo |

FOREIGN PATENT DOCUMENTS

| | | |
|---|---|---|
| EP | 0 287 109 A2 | 10/1988 |
| EP | 0 516 848 A1 | 12/1992 |
| EP | 0 874 446 A1 | 10/1998 |
| EP | 0 993 105 A1 | 4/2000 |
| EP | 1 087 508 A1 | 3/2001 |
| EP | 1 213 822 A1 | 6/2002 |
| JP | 2004/236461 | 8/2004 |
| WO | WO 03/050637 A2 | 6/2003 |
| WO | WO 03/055072 A1 | 7/2003 |
| WO | WO 2006/067522 A3 | 6/2006 |
| WO | WO 2006/067523 A3 | 6/2006 |

* cited by examiner

POWER SUPPLY DRIVER CIRCUIT

CROSS-REFERENCE TO RELATED APPLICATIONS

This application claims priority under 35 U.S.C. § 119 to United Kingdom Patent Application No. 0525619.3, filed Dec. 16, 2005, which is incorporated in its entirety by reference herein. This application also claims the benefit of U.S. Provisional Application No. 60/756,537, filed Jan. 5, 2006, which is incorporated in its entirety by reference herein.

BACKGROUND OF THE INVENTION

1. Field of the Invention

This invention is generally concerned with what are known in the art as high-side driver circuits, in particular for switching power supplies.

2. Description of the Related Art

Broadly speaking, a high-side driver is a circuit which transforms a low-side (low voltage) gate drive signal, generally referenced to a system and/or chip ground, to a high-side (high voltage) gate drive signal which is typically referenced to the mid-point of a half bridge. This mid-point has a potential which can vary between, for example, 0 and 500 volts above the system or chip/PCB (Printed Circuit Board) ground. Often the mid-point potential is rapidly varying over a range of several hundred volts. The high-side driver circuit provides a means of translating or communicating between the low (voltage)-side and the high (voltage)-side circuitry.

FIG. 1 shows an example fluorescent lamp driver circuit 100 incorporating a high-side driver 110.

The lamp driver has a mains power supply input 102 to a rectifier and filter stage 104, for example comprising a bridge rectifier and smoothing capacitors, which provides a low voltage supply to a control circuit 106. The rectifier and filter stage 104 also provides a high voltage supply 109, optionally via a PFC (Power Factor Control) stage 108.

The control circuit provides set and reset outputs to a pair of level shift transistors which provide input signals to high-side driver 110. The control circuit also provides a low-side drive signal to a low-side gate drive circuit 114. The high-side drive 110 drives a high-side switching transistor 116a and the low-side gate drive drives a low-side switching transistor 116b. Transistors 116a and 116b form a half-bridge coupled between the high voltage supply and a system ground rail 118. The high-side driver 110 is connected to a mid-point 120 of the half-bridge. This mid-point also provides a high (alternating current) voltage output to lamp and resonant capacitor 122 via a dc blocking capacitor and resonant inductor 124.

In operation the low-side drive signal typically comprises a waveform with a duty cycle of around 40 percent. Similarly the set and reset signals are controlled so that the drive to the high-side transistor also has a duty cycle of around 40 percent. The low-side and high-side transistor drive waveforms are aligned so that the low-side transistor and high-side transistor are not on simultaneously, the less than 50 percent duty cycle waveforms providing a degree of tolerance in achieving this.

A difficulty with design of the high-side driver is that the signal (usually in the form of a current) which is used to communicate between the low-side and high-side circuitry is easily confused by system noise, especially when the half-bridge is switching.

Conventional solutions to this problem rely on either making the communicating signal very large relative to the interfering signals, with a consequent waste of power, or on using blanking signals which blank out the (regular) interfering signal. As the interfering signals happen at known times, in particular when the mid-point of the bridge is flying (transitioning) high or low, blanking pulses can be used to blank out these signals, but this approach also wastes power, is tricky to implement, and is prone to error. Background prior art can be found in: U.S. Pat. Nos. 4,994,955; 6,897,492; 6,781,422; 6,781,423; 5,274,274; 5,068,571; and WO2003/055072.

SUMMARY OF THE INVENTION

According to a first aspect of the invention, there is therefore provided a high-side driver circuit for a switching power supply, the power supply having a switching control system operating from a first voltage supply and a power switching device configured to switch a second voltage supply higher than said first voltage supply, said first voltage supply having a first ground rail, said power switching device having a switching control connection for controlling switching of said second voltage supply, said high-side driver circuit being configured to translate a low-side switching control signal from said switching control system and referenced to said first ground rail to a high-side switching control signal referenced to a second, high-side ground rail for driving said switching control connection of said power switching device, said low-side switching control signal comprising a first signal for switching said power switching device on and a second signal for switching said power switching device off, said high-side driver circuit comprising: first and second inputs to receive said first and second low-side switching control signals; a differential amplifier having a differential pair of inputs coupled to said first and second inputs and having an output, said differential amplifier having a ground connection for connection to said high-side ground rail and a power connection to receive a power supply from said second voltage supply; and an output coupled to said differential amplifier output to provide said high-side switching control signal.

As mentioned above, typically the second, high-side ground rail oscillates (because of the action of the power switching device) between around 0V and a positive voltage of 100V or more. By contrast the first (low) voltage supply typically operates at less than 20V, for example around 5V. The power switching device should therefore be suitable for switching a voltage of greater than 100V, and generally at a power of greater than 1 watt.

In preferred embodiments a level shift circuit is coupled between the first and second inputs of the high-side driver and the pair of inputs of the differential amplifier. Such a level shift circuit may comprise a pair of level shift transistors, in particular connected to the first ground rail.

The differential amplifier may have a single-ended output for driving the high-side transistor, but in preferred embodiments, the differential amplifier output comprises first and second differential outputs. These may then be used to drive a set-reset latch with inputs coupled to these differential amplifier outputs, an output of the latch being used to drive the high-side transistor.

In some particularly preferred embodiments the latch has set and reset inputs which have a threshold voltage within 20 percent of a supply voltage Vdd of the high-side driver circuit, more particularly of the differential amplifier. That is the threshold voltages of the latch are preferably within 20 percent of a difference between the second voltage supply and the high-side ground rail.

In preferred embodiments the differential amplifier has a tail connected to the power connection for the differential amplifier, more particularly to the second (high-side) voltage supply. The differential amplifier preferably comprises a differential pair of transistors both coupled to the tail of the differential amplifier, providing a pair of output arms. Preferably each output arm comprises a transistor connected as a resistive load (rather than a conventional current mirror-type load). Preferably each of these load transistors has a control (for example, gate) connection coupled to a fixed voltage supply, for example the high-side voltage supply rail. This helps to keep the differential mode gain of the differential amplifier low—which is advantageous because, although the differential mode gain would be larger with a current mirror-type load, the common mode gain would also be increased. Preferably the differential amplifier has a differential mode gain of less than 10 or even less than 5.

In embodiments of the circuit, broadly speaking the use of a differential amplifier helps to reduce the vulnerability of the circuit to common mode signals which arise when the midpoint of the bridge of the circuit of FIG. 1 is flying (transitioning) high or low.

In some preferred embodiments the tail current of the differential amplifier is set by a current mirror output, an input current to the current mirror being set by a further transistor connected as a resistor. Preferably a control (for example gate) connection is connected to a fixed voltage, more preferably the same fixed voltage as that to which the resistive load transistors of the differential amplifier are connected, for example the high-side supply rail.

In some preferred embodiments of the high-side driver circuit the inputs to the differential amplifier, more particularly to the differential pair of the differential amplifier, are clamped by respective voltage clamps. Each voltage clamp is preferably connected between a differential input and the high-side supply rail. The voltage clamp may comprise a zener diode or, in a process without zener diodes, by one or more forward-biased diodes in series in anti-parallel with a single reverse-biased diode.

Preferably a resistor is connected across each voltage clamp or zener, to discharge its capacitance. For example, when one of the level-shift transistors turns on, providing an input to the differential amplifier, a voltage is developed across the voltage clamp (zener) diode and its capacitance is charged. When the input, more particularly the level-shift transistor, turns off the resistor discharges this capacitance, thus attenuating an erroneous differential mode input signal to the differential amplifier which would otherwise be present.

Preferably the high-side driver circuit also includes a filter on the differential amplifier output to reduce or substantially remove noise which may arise from spurious differential mode signals.

In certain embodiments, the invention also provides a switching power supply including a high-side driver circuit as described above. Where this switching power supply includes a half-bridge, the high-side ground rail may be coupled to a mid-point of this half-bridge. The switching power supply may be configured as a (dc) switch mode power supply, or a power supply for driving a (fluorescent) lamp load or some other type of switching power supply.

In certain embodiments, the invention further provides a method of translating a low voltage control signal for a power switching device of a switching power supply into a control signal referenced to a ground which varies over a range of at least 100 volts with respect to voltage control signal as a consequence of said power device switching, the method comprising: inputting a differential control signal at a first voltage for controlling said power device switching; amplifying said differential control signal using a differential amplifier to provide a differential control signal output referenced to said varying ground.

Preferably the differential control signal amplifying has a gain of less than 10, thus reducing the sensitivity of the method to common mode signals. The method may further comprise driving the power switching device using the differential control signal output, in particular converting the differential control signal output to a single-ended control signal, for example using a set-reset latch.

In certain embodiments, the invention further provides a circuit for translating a low voltage control signal for a power switching device of a switching power supply into a control signal referenced to a ground which varies over a range of at least 100 volts with respect to said low voltage control signal as a consequence of said power device switching, the circuit comprising: means for inputting a differential control signal at a first voltage for controlling said power device switching; and means for amplifying said differential control signal using a differential amplifier to provide a differential control signal output referenced to said varying ground.

BRIEF DESCRIPTION OF THE DRAWINGS

These and other aspects of the invention will now be further described, by way of example only, with reference to the accompanying figures in which.

DETAILED DESCRIPTION OF THE PREFERRED EMBODIMENT

Figure 1:
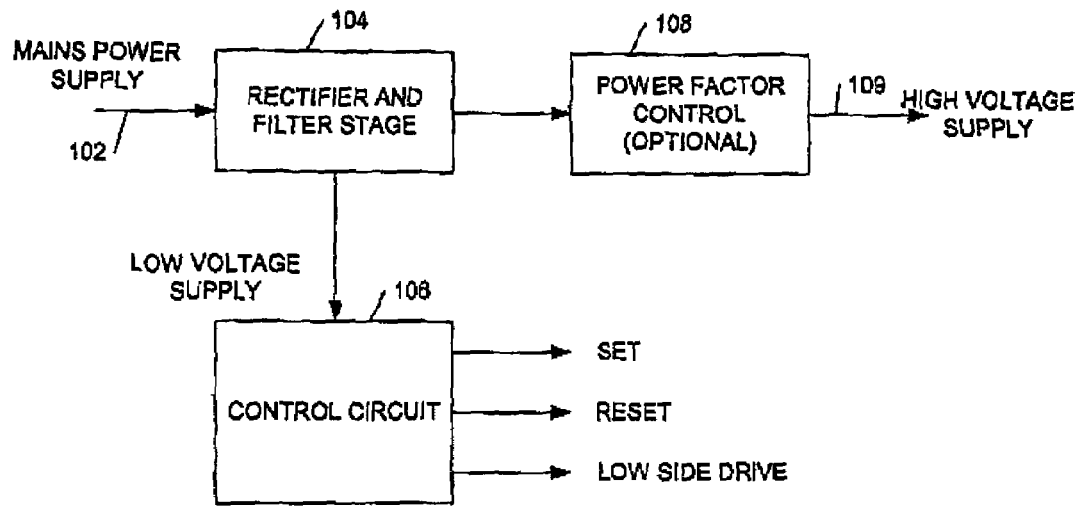
FIG. 1 shows an example of a switching power supply driving a lamp load.
Figure 1:
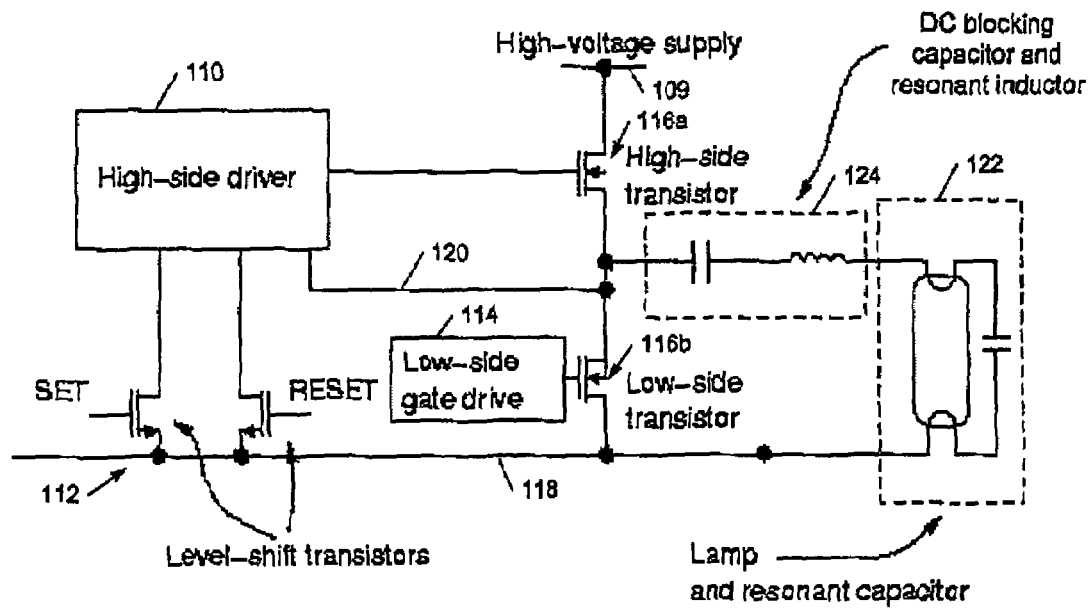
Figure 2:
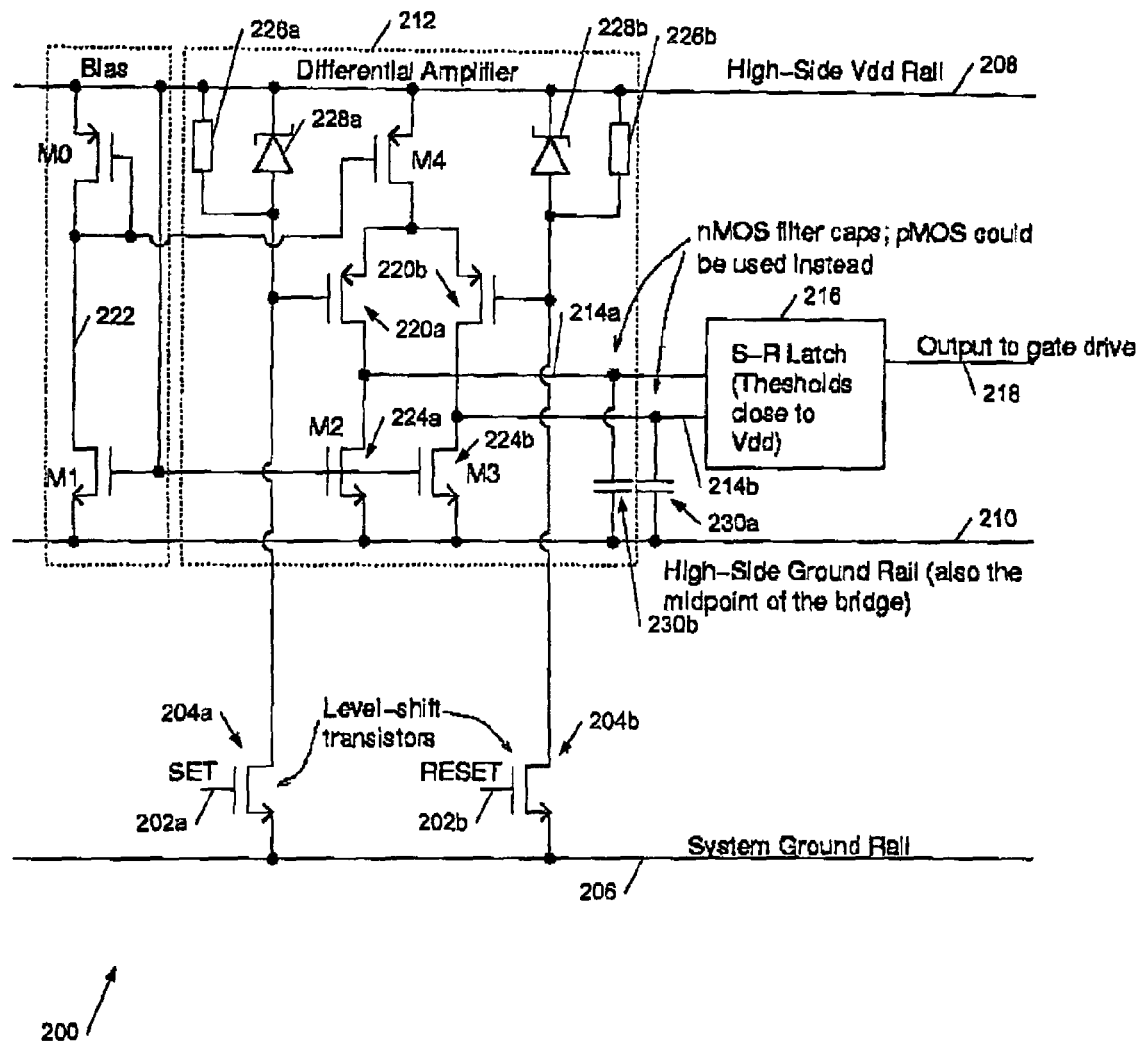
FIG. 2 shows an embodiment of a high-side driver circuit according to an aspect of the invention.

Referring to FIG. 2, this shows an example of a high-side driver circuit 200 which may be employed, for example, in the switching power supply of FIG. 1, as well as in other types of switching power supply.

Referring to FIG. 2, two signals are used to communicate between the low voltage side and the high voltage side of the circuit. In this example these are "set" 202a and "reset" 202b signals which, in the example circuit of FIG. 1, turn the gate of the high-side device 116a in the half-bridge 116a, b on an off respectively.

Two transistors 204a, b provide a level-shift function, having their source connections connected to a system ground rail 206 and their drain connections coupled (indirectly) to the high-side Vdd rail 208. These transistors transmit the set and reset signals to the high-side circuit by turning on for brief periods of time.

In FIG. 2, broadly speaking, the high-side part of the circuit is that drawn above high-side ground rail 210 (which in the example of FIG. 1 is connected to the mid-point 120 of the half bridge 116a, b). In operation the high-side ground rail 210 moves up and down, sometimes by 300-400V or more (above system ground rail 206) but the high-side Vdd rail 208 always remains at Vdd above the ground rail 210. Typically Vdd is less than 10V, for example around 5V.

In operation, when the mid-point 120 of the half-bridge is flying high or low, common mode currents (that is, the same current in the "set" and "reset" nets) flow through the wires connecting the drains of the level shift devices to the high-side circuitry. These common-mode currents can be confused with the intended set and reset signals. Therefore, a differential amplifier, indicated by dashed box 212, is employed in the high-side circuit to differentiate between differential mode signals, such as single pulses on the set or reset transistors, and common-mode signals, which occur as described above when the mid-point bridge is flying high or low. The differential amplifier has a differential (balanced) output 214a, b which is used to set or reset an S-R latch 216 which provides an output 218 to drive the gate of a high-side switching device such as high-side transistor 116a in the circuit of FIG. 1.

Referring in more detail to the circuit of FIG. 2, the differential amplifier 212 comprises a differential pair of (in this example PMOS) transistors 220a, b with their source connections connected together to a current bias transistor M4. Transistor M4 is the output of a current mirror, the input to which is formed by transistor M0. The current input to the current mirror, more particularly to transistor M0 in line 222 is set by the resistance of transistor M1, which is connected as a resistor with its gate connected to the high-side Vdd rail 208.

Each of the transistors 220a, b of the differential pair has a respective load resistor 224a, b, each formed by a transistor M2, M3 with a gate connection connected to Vdd rail 208. As mentioned above, by using a resistor load for each of the differential pair of transistors, rather than a current mirror load, the common-mode gain is reduced (albeit with the differential mode gain). If transistors M1, M2 and M3 are all the same size (width) then the same current will flow in line 222 as in the output arms of the differential pair and transistors M4 and M0 should therefore have a size ratio of M4:M0=2:1. Alternatively M0 and M4 could be the same size and M1 half the size of M2 and M3 (M2 and M3 having the same size).

Thus, broadly speaking, the gain of the differential amplifier is kept low by the use of resistive loads because the differential mode signals are large. The output of the differential amplifier for a given differential mode signal is set by the bias circuit (M0 and M1), the ratio of M1 to the transistors M2 and M3 used as resistive loads in the differential amplifier circuit, and the ratio of the bias transistors M0 and M4. This ensures that the output of the differential amplifier remains constant for a wide variety of process corners, supply voltages and temperatures.

Preferably the differential mode gain is set at a level which is just sufficient to give a logic-level output to drive the S-R latch 216 for a typical differential input signal, so that the common-mode gain is kept extremely low. This reduces the risk of the S-R latch 216 being accidentally set or reset when the differential amplifier sees common mode signals. More particularly, the gain of the differential amplifier is set to give a threshold voltage which is just enough to switch latch 216 in a worst case design scenario. This worst case depends upon the value of Vdd, and also on the operation of the voltage clamps (described below). In outline, in a typical worst case scenario the input to the differential amplifier is set by a potential divider comprising one of the resistors 226 and the resistance of the level shift transistor 204 (when in sufficient current flows through a zener diode 228 for it to perform its clamping action). For an example Vdd of 5V a minimum differential mode worst case input voltage may be, for example, around 4V, and the differential mode gain is chosen accordingly (given the threshold switching voltage of latch 216.

Despite the use of a differential amplifier, mismatch in the level-shift devices can cause differential mode signals to occur for brief periods when the mid-point of the bridge (line 210) is flying high or low. Therefore, preferably the output of the differential amplifier is filtered by MOS (Metal Oxide Semiconductor) capacitors 230a, b to remove these pulses. As can be seen from FIG. 2, preferably the circuit is implemented in MOS technology and either PMOS capacitors to Vdd or NMOS capacitors to ground may be employed, although the latter is preferable due to the reduced chance of coupling supply noise to the input of the S-R latch 216. The filter should have a time constant of less than 1 microsecond, for example around 200 ns and the value of the capacitor can be determined from this and the effective output resistance of transistors M2 and M3. A typical capacitance value is of order 2pF. Broadly speaking larger capacitance values (longer time constants) are better for noise immunity but it is also desirable to be able to provide short pulses to the level shift transistors 204. The filtering should not be too great otherwise the desired output pulses will be filtered and will thus fail to set and reset latch 216.

Figure 3:
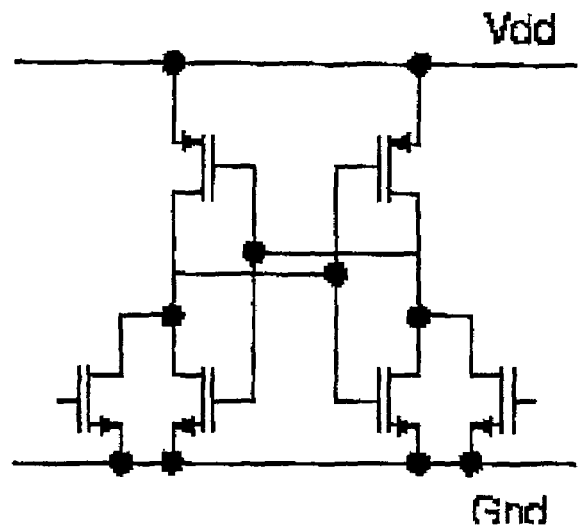
FIG. 3 shows and example set-reset latch circuit for use with the high-side driver circuit of FIG. 2.

Any conventional set-reset latch design may be employed in the circuit of FIG. 2. However it is preferable that the threshold voltages on lines 214a, b for setting and resetting the latch can be close to Vdd, for example, within 20 percent or even 10 percent of Vdd. FIG. 3 shows an example S-R latch design which allows the threshold voltage to be biased well away from ground, thus increasing the circuits immunity to noise on the output of the differential amplifier. Referring again to FIG. 2, a zener diode 228a, b connects the input of each of the transistors of the differential pair to the high-side Vdd rail 208. These zener diodes, load the level-shift transistors 204 and ensure that the inputs of the differential amplifier see the same voltage (with respect to the Vdd line). When a set or reset pulse is present, irrespective of the potential between the high-side circuit (ground rail 210 or Vdd rail 208) and system ground rail 206. In a process without zener diodes, the zener diodes in the schematic may be replaced with, for example, four forward-biased diodes in series in anti-parallel with a single reverse-biased diode.

Resistors 226a, b are connected in parallel with zener diodes 228a, b to ensure that the inputs of the differential amplifier see a high enough input voltage (that is, sufficiently below high-side Vdd rail 208 remembering that transistors 220a, b are PMOS devices) when the potential of the high-side Vdd supply is very low. This can occur, for example, when the mid-point of the bridge (and hence line 210) is close to or even below system ground 206 (because of the resonance action of the load, the high-side ground rail 210 can go one diode drop, approximately 0.7 V below system ground rail 206). A typical zener voltage is of order 5V to 10V; the resistors may have a value of order 100kΩ. As mentioned above, the resistors 226a, b discharge the voltage developed across a zener diode and stored on its capacitance when the corresponding level-shift transistor turns off, thus damping a potential spurious differential mode signal.

When the high-side ground rail 210 is flying (transitioning) high the zener diodes 228 conduct current in reverse-bias (that is against the normal diode direction) to charge the capacitance of the level-shift transistors 204, thus generating the above-described common-mode signals. When the high-side ground rail 210 is flying (transitioning) low the zener diodes conduct current in forward-bias direction to discharge the capacitance of the level-shift transistors (because this capacitance is now charged to a higher voltage than the high-side Vdd rail). In this latter case the generated common mode signal is above the high-side Vdd supply rail and hence neither input transistor of the differential amplifier is turned on. Thus when the high-side ground rail 210 is flying (transitioning) low there is substantially no danger of spurious triggering of the S-R latch 216 from common-mode signals.

Figure 4:
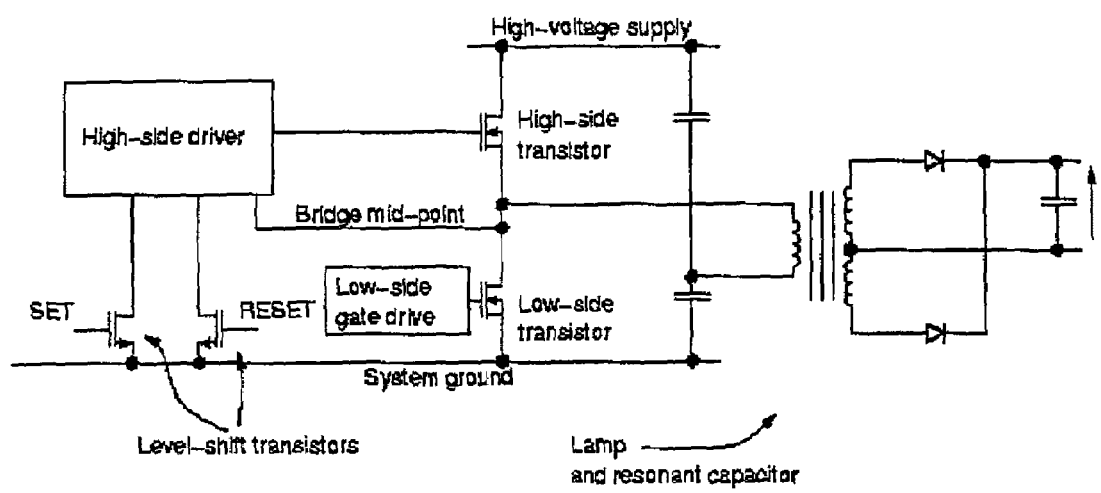
FIG. 4 shows an example of a switch mode power supply (SMPS) including the high-side driver circuit of FIG. 2.

FIG. 4 shows an example of a switch mode power supply incorporating a high-side driver circuit as shown in FIG. 2, for improved reliability of transforming a low-side gate drive signal to a high-side gate drive signal.

Broadly speaking we have described the use of a differential amplifier with low gain the high voltage side of a high-side driver to differentiate between true set-reset signals and common-mode signals due to switching taking place. Embodiments of the circuit provide a reduced power consumption and do not need circuitry to generate blanking pulses. A switching power supply with a lamp load and a dc switch mode powder supply circuit have been given as examples of applications of the above described high-side driver circuit, but the skilled person will recognise that many other applications exist for this circuit.

No doubt many other effective alternatives will occur to the skilled person. It will be understood that the invention is not limited to the described embodiments and encompasses modifications apparent to those skilled in the art lying within the spirit and scope of the claims appended hereto.

What is claimed is:

1. A high-side driver circuit for a switching power supply, the power supply having a switching control system operating from a first voltage supply and a power switching device configured to switch a second voltage supply higher than said first voltage supply, said first voltage supply having a first ground rail, said power switching device having a switching control connection for controlling switching of said second voltage supply, said high-side driver circuit being configured to translate a low-side switching control signal from said switching control system and referenced to said first ground rail to a high-side switching control signal referenced to a second, high-side ground rail for driving said switching control connection of said power switching device, said low-side switching control signal comprising a first signal for switching said power switching device on and a second signal for switching said power switching device off, said high-side driver circuit comprising:
   first and second inputs to receive said first and second low-side switching control signals;
   a differential amplifier having a differential pair of inputs coupled to said first and second inputs and having an output, said differential amplifier having a ground connection for connection to said high-side ground rail and a power connection to receive a power supply from said second voltage supply, wherein said differential amplifier has a pair of output arms comprising respective first and second transistors each connected as a resistive load;
   an output coupled to said differential amplifier output to provide said high-side switching control signal; and
   a current mirror, wherein said differential amplifier has a tail current set by said current mirror, wherein an input current to said current mirror is set by a third transistor connected as a resistor, and wherein control connections of said first, second and third transistors are coupled to a common voltage supply.

2. A high-side driver circuit as claimed in claim 1 wherein said driver circuit further comprises a level shift circuit coupled between said first and second inputs and said differential pair of inputs of said differential amplifier.

3. A high-side driver circuit as claimed in claim 1 wherein said differential amplifier has a differential mode gain of less than 10.

4. A high-side driver circuit as claimed in claim 1 wherein said differential amplifier has a tail connected to said power connection.

5. A high-side driver circuit as claimed in claim 1 wherein each of said differential pair of inputs has a respective voltage clamp between the differential input and said power connection.

6. A high-side driver circuit as claimed in claim 5 wherein a said voltage clamp comprises a zener diode.

7. A high-side driver circuit as claimed in claim 5 further comprising a resistor connected across each said voltage clamp.

8. A switching power supply including the high-side driver circuit of claim 1.

9. A switching power supply as claimed in claim 8 wherein said switching of said power switching device causes said high-side ground rail to oscillate with a voltage variation of at least 100 volts.

10. A switching power supply as claimed in claim 8 including a half bridge, and wherein said high-side ground rail is coupled to a mid-point of said half bridge.

11. A switching power supply as claimed in claim 8 configured for driving a lamp load.

12. A switching power supply as claimed in claim 8 configured as a dc switch mode power supply.

13. A high-side driver circuit for a switching power supply, the power supply having a switching control system operating from a first voltage supply and a power switching device configured to switch a second voltage supply higher than said first voltage supply, said first voltage supply having a first ground rail, said power switching device having a switching control connection for controlling switching of said second voltage supply, said high-side driver circuit being configured to translate a low-side switching control signal from said switching control system and referenced to said first ground rail to a high-side switching control signal referenced to a second, high-side ground rail for driving said switching control connection of said power switching device, said low-side switching control signal comprising a first signal for switching said power switching device on and a second signal for switching said power switching device off, said high-side driver circuit comprising:
   first and second inputs to receive said first and second low-side switching control signals;
   a differential amplifier having a differential pair of inputs coupled to said first and second inputs and having an output, said differential amplifier having a ground connection for connection to said high-side ground rail and a power connection to receive a power supply from said second voltage supply;
   an output coupled to said differential amplifier output to provide said high-side switching control signal; and
   wherein said differential amplifier output comprises first and second differential outputs, wherein said driver circuit further comprises a set-reset latch having set and reset inputs coupled to said first and second differential amplifier outputs and having an output coupled to said driver circuit output, and wherein said set and reset inputs have a threshold voltage for setting and resetting said latch of within 20% of a difference between said second voltage supply and said high-side ground rail.

14. A high-side driver circuit as claimed in claim 13 wherein said driver circuit further comprises a level shift circuit coupled between said first and second inputs and said differential pair of inputs of said differential amplifier.

15. A high-side driver circuit as claimed in claim 13 wherein said differential amplifier has a differential mode gain of less than 10.

16. A high-side driver circuit as claimed in claim 13 wherein said differential amplifier has a tail connected to said power connection.

17. A high-side driver circuit as claimed in claim 13 wherein each of said differential pair of inputs has a respective voltage clamp between the differential input and said power connection.

18. A high-side driver circuit as claimed in claim 17 wherein a said voltage clamp comprises a zener diode.

19. A high-side driver circuit as claimed in claim 17 further comprising a resistor connected across each said voltage clamp.

20. A switching power supply including the high-side driver circuit of claim 13.

21. A switching power supply as claimed in claim 20 wherein said switching of said power switching device causes said high-side ground rail to oscillate with a voltage variation of at least 100 volts.

22. A switching power supply as claimed in claim 20 including a half bridge, and wherein said high-side ground rail is coupled to a mid-point of said half bridge.

23. A switching power supply as claimed in claim 20 configured for driving a lamp load.

24. A switching power supply as claimed in claim 20 configured as a dc switch mode power supply.

25. A high-side driver circuit for a switching power supply, the power supply having a switching control system operating from a first voltage supply and a power switching device configured to switch a second voltage supply higher than said first voltage supply, said first voltage supply having a first ground rail, said power switching device having a switching control connection for controlling switching of said second voltage supply, said high-side driver circuit being configured to translate a low-side switching control signal from said switching control system and referenced to said first ground rail to a high-side switching control signal referenced to a second, high-side ground rail for driving said switching control connection of said power switching device, said low-side switching control signal comprising a first signal for switching said power switching device on and a second signal for switching said power switching device off, said high-side driver circuit comprising:

first and second inputs to receive said first and second low-side switching control signals;

a differential amplifier having a differential pair of inputs coupled to said first and second inputs and having an output, said differential amplifier having a ground connection for connection to said high-side ground rail and a power connection to receive a power supply from said second voltage supply;

an output coupled to said differential amplifier output to provide said high-side switching control signal; and wherein said differential amplifier output comprises first and second differential outputs, and further comprising first and second filter capacitors coupled to said first and second differential outputs.

26. A high-side driver circuit as claimed in claim 25 wherein said driver circuit further comprises a level shift circuit coupled between said first and second inputs and said differential pair of inputs of said differential amplifier.

27. A high-side driver circuit as claimed in claim 25 wherein said differential amplifier has a differential mode gain of less than 10.

28. A high-side driver circuit as claimed in claim 25 wherein said differential amplifier has a tail connected to said power connection.

29. A high-side driver circuit as claimed in claim 25 wherein each of said differential pair of inputs has a respective voltage clamp between the differential input and said power connection.

30. A high-side driver circuit as claimed in claim 29 wherein a said voltage clamp comprises a zener diode.

31. A high-side driver circuit as claimed in claim 29 further comprising a resistor connected across each said voltage clamp.

32. A switching power supply including the high-side driver circuit of claim 25.

33. A switching power supply as claimed in claim 32 wherein said switching of said power switching device causes said high-side ground rail to oscillate with a voltage variation of at least 100 volts.

34. A switching power supply as claimed in claim 32 including a half bridge, and wherein said high-side ground rail is coupled to a mid-point of said half bridge.

35. A switching power supply as claimed in claim 32 configured for driving a lamp load.

36. A switching power supply as claimed in claim 32 configured as a dc switch mode power supply.

\* \* \* \* \*

UNITED STATES PATENT AND TRADEMARK OFFICE
CERTIFICATE OF CORRECTION

| | | |
|---|---|---|
| PATENT NO. | : 7,710,098 B2 | Page 1 of 1 |
| APPLICATION NO. | : 11/639820 | |
| DATED | : May 4, 2010 | |
| INVENTOR(S) | : Garner et al. | |

It is certified that error appears in the above-identified patent and that said Letters Patent is hereby corrected as shown below:

In column 1 at line 50 Change "de" to --dc--.

In column 5 at line 39 Change "This." to --This--.

In column 5 at line 41 Change "comers," to --corners,--.

In column 7 at line 6 After "gain" insert --on--.

In column 7 at line 12 Change "powder" to --power--.

Signed and Sealed this

Thirtieth Day of November, 2010

David J. Kappos
*Director of the United States Patent and Trademark Office*